US008860070B2

(12) United States Patent
Lee

(10) Patent No.: US 8,860,070 B2
(45) Date of Patent: Oct. 14, 2014

(54) VERTICAL GALLIUM NITRIDE-BASED LIGHT EMITTING DIODE AND METHOD OF MANUFACTURING THE SAME

(75) Inventor: Jong Lam Lee, Phohang-si (KR)

(73) Assignees: Seoul Viosys Co., Ltd., Ansan-si (KR); Pohang University of Science and Technology Academy-Industry Foundaton, Pohang-si (KR)

( * ) Notice: Subject to any disclaimer, the term of this patent is extended or adjusted under 35 U.S.C. 154(b) by 0 days.

(21) Appl. No.: 13/512,269

(22) PCT Filed: Nov. 25, 2010

(86) PCT No.: PCT/KR2010/008403
§ 371 (c)(1),
(2), (4) Date: May 25, 2012

(87) PCT Pub. No.: WO2011/065766
PCT Pub. Date: Jun. 3, 2011

(65) Prior Publication Data
US 2012/0286287 A1 Nov. 15, 2012

(30) Foreign Application Priority Data

Nov. 27, 2009 (KR) .................. 10-2009-0116122

(51) Int. Cl.
  H01L 33/00 (2010.01)
  H01L 31/0256 (2006.01)
  H01L 21/00 (2006.01)
  H01L 33/22 (2010.01)
  H01L 33/30 (2010.01)

(52) U.S. Cl.
  CPC ............. H01L 33/22 (2013.01); H01L 33/30 (2013.01); H01L 33/305 (2013.01)
  USPC ........... 257/99; 257/76; 257/E33.025; 438/29

(58) Field of Classification Search
  CPC ........ H01L 33/22; H01L 33/30; H01L 33/305
  USPC .................. 257/99, 76, E33.025; 438/29
  See application file for complete search history.

(56) References Cited

U.S. PATENT DOCUMENTS 7,838,317 B2 * 11/2010 Yoon et al. ............ 438/47
7,859,109 B2 * 12/2010 Lee ....................... 257/751
(Continued)

FOREIGN PATENT DOCUMENTS

JP      2008-283037    11/2008
KR  10-2007-0006966     1/2007
(Continued)

OTHER PUBLICATIONS

International Search Report of PCT/KR2010/008403 dated Jun. 30, 2011.

(Continued)

*Primary Examiner* — David S Blum
(74) *Attorney, Agent, or Firm* — H.C. Park & Associates, PLC

(57) ABSTRACT

The present disclosure provides a vertical GaN-based semiconductor diode and a method of manufacturing the same. The GaN-based πi-V group semiconductor device includes a substrate, a p-type ohmic electrode layer on the substrate, a p-type GaN-based πi-V group compound semiconductor layer on the p-type ohmic electrode layer, an n-type GaN-based πi-V group compound semiconductor layer on the p-type GaN-based πi-V group compound semiconductor layer, and an n-type ohmic electrode layer on the n-type GaN-based IE-V group compound semiconductor layer. The p-type ohmic electrode layer is an Ag-based highly reflective electrode having a high reflectivity of 70% or more, and a surface of the n-type GaN-based E-V group compound semiconductor layer is subjected to at least one of a process of forming photonic crystals and a process of surface roughening.

21 Claims, 5 Drawing Sheets

(56) References Cited

U.S. PATENT DOCUMENTS

| | | |
|---|---|---|
| 2005/0173714 A1 | 8/2005 | Lee et al. |
| 2005/0205883 A1* | 9/2005 | Wierer et al. ............... 257/98 |
| 2006/0043384 A1* | 3/2006 | Cho et al. ................. 257/79 |
| 2007/0018183 A1* | 1/2007 | Denbaars et al. ........... 257/98 |
| 2007/0102711 A1* | 5/2007 | Aoyagi et al. ............. 257/79 |
| 2007/0257269 A1* | 11/2007 | Cho et al. ................. 257/95 |
| 2008/0230904 A1* | 9/2008 | Lee ...................... 257/751 |
| 2008/0277679 A1 | 11/2008 | Akimoto |
| 2009/0242924 A1* | 10/2009 | Lin et al. ................. 257/99 |
| 2010/0133529 A1* | 6/2010 | Taraschi et al. ............ 257/43 |
| 2010/0133570 A1* | 6/2010 | Jang et al. ................. 257/98 |
| 2010/0314645 A1 | 12/2010 | Kim |

FOREIGN PATENT DOCUMENTS

| | | |
|---|---|---|
| KR | 10-2009-0071088 | 7/2009 |
| KR | 10-2009-0080218 | 7/2009 |
| WO | 2009/060227 | 5/2009 |

OTHER PUBLICATIONS

The First Office Action issued on May 30, 2014 in Chinese Patent Application No. 201080053614.6.

* cited by examiner

VERTICAL GALLIUM NITRIDE-BASED LIGHT EMITTING DIODE AND METHOD OF MANUFACTURING THE SAME

CROSS-REFERENCE TO RELATED APPLICATIONS

This application is the National Stage of International Application No. PCT/KR2010/008403, filed on Nov. 25, 2010, which claims priority from and the benefit of Korean Patent Application No. 10-2009-0116122, filed on Nov. 27, 2009, both of which are incorporated by reference for all purposes as if fully set forth herein.

BACKGROUND OF THE INVENTION

1. Field of the Invention

The present disclosure relates to a technology for an improvement in optical output from a vertical type gallium nitride (GaN)-based light emitting diode using an Ag-based highly reflective p-type electrode, quasi-photonic crystal, and surface roughening.

2. Discussion of the Background

With various advantageous features, such as high energy conversion efficiency, long operational lifespan, high directionality, low voltage operation, elimination of preheating time and complex drive circuit, high resistance to impact and vibration, GaN-based white light emitting diodes enable implementation of high quality lighting systems in various ways, and it is anticipated that the GaN-based white light emitting diodes, i.e. a solid-state lighting source, will replace existing light sources, such as incandescent lamps, fluorescent lamps, and mercury lamps, within 5 years. For the GaN-based light emitting diode to be used as a white light source, so as to function as a substitute for existing mercury or fluorescent lamps, it is necessary to have not only excellent thermal stability but also high optical output at low power consumption.

Current horizontal GaN-based light emitting diodes widely used as a white light source in the art have merits such as relatively low manufacturing costs and a simple manufacturing process, but have a fundamental problem in that they are not suitable for a high output light source which requires high operation voltage and a wide area. Vertical light emitting diodes have been developed to solve the problem of the horizontal light emitting diode while allowing easy application to a large area, high output light emitting diode. This vertical light emitting diode has various advantages over existing horizontal light emitting diodes.

The vertical light emitting diode may achieve very uniform current spreading due to low current spreading resistance, thereby providing high optical output at lower operation voltage. Further, since the vertical light emitting diode allows efficient heat discharge through a metal or semiconductor substrate having good thermal conductivity, the vertical light emitting diode exhibits a longer operational lifespan and allows remarkably improved, high output operation. It seems certain that such a vertical light emitting diode will be widely used as a white light source given the 3-4 fold increase in maximum applicable electric current, as compared to horizontal light emitting diodes. Accordingly, not only leading foreign light emitting diode companies, such as NICHIA CHEMICAL CO., LTD. in Japan, PHILIPS LUMILEDS CO., LTD. in the U.S.A., and OSRAM OPTO SEMICONDUCTORS GMBH in Germany, but also domestic companies, such as SEOUL SEMICONDUCTOR CO., LTD., SAMSUNG ELECTRONICS CO., LTD., LG INNOTEK CO., LTD., have researched commercialization and performance improvement of the vertical GaN-based light emitting diodes. Particularly, some companies including OSRAM OPTO SEMICONDUCTORS GMBH have already provided related products to the market.

In order for such a vertical GaN-based light emitting diode to have improved optical output, a p-type ohmic electrode layer formed between a substrate and a p-type semiconductor layer must be a highly reflective electrode which can achieve total non-absorptive reflection. Accordingly, Au-based p-type electrodes such as Ni/Au, Pd/Au, and Pt/Au, which are widely used in existing horizontal light emitting diodes, cannot be used for the vertical light emitting diodes due to their low reflectivity of 40% or less. Therefore, it is necessary to form an Ag-based p-type electrode exhibiting low contact resistance, good thermal stability and high reflectivity in order to improve performance of the vertical light emitting diode.

SUMMARY OF THE INVENTION

The present disclosure provides a technology for enabling a significant improvement in optical output from a vertical GaN-based light emitting diode using an Ag-based highly reflective p-type electrode, quasi-photonic crystal, and surface roughening.

To achieve a significant improvement in optical output from a vertical GaN-based light emitting diode, reformation of an n-type semiconductor layer at an upper portion of the diode may be conceived in addition to formation of a highly reflective p-type electrode. When an n-type semiconductor layer has a smooth and flat surface, a considerable amount of light generated in an active layer cannot be emitted due to total internal reflection occurring at an interface between the atmosphere and a semiconductor layer, thereby making it difficult to obtain high optical output. Accordingly, it is necessary to allow the light to be emitted with minimal loss by intentionally reforming the surface of the semiconductor layer to prevent total reflection. Taking this into consideration, pores or protrusions, several hundred nanometers to several microns in size, are repeatedly arranged on the surface of the n-type semiconductor by lithography to form photonic crystals thereon, or hexagonal pyramids are formed on the surface of the n-type semiconductor through surface roughening using a basic solution such as KOH or NaOH, thereby significantly increasing light extraction outside the device.

The present disclosure relates to an improvement in optical output from a vertical GaN-based light emitting diode using an Ag-based highly reflective p-type electrode, quasi-photonic crystal, and surface roughening. When all of these schemes were applied to a process of manufacturing a light emitting diode, the results showed 9 times or more increase of surface optical output as compared to the conventional case. That is, these three schemes provide noticeable increase synergies for optical output. On the contrary, when the formation of the quasi-photonic crystals or surface roughness was applied to the Au-based p-type electrode, optical output increase was negligible. Accordingly, the present disclosure shows that the Ag-based highly reflective p-type electrode is primarily responsible for improvement in optical output using surface reformation.

The technology according to the present disclosure using an highly reflective p-type electrode, quasi-photonic crystals and surface roughness may be immediately applied to a process of manufacturing common GaN-based light emitting diodes, and may achieve a significant improvement in optical output from the light emitting diode to bring forth the era of solid state lighting based on the GaN-based light emitting diodes as a white light source. Furthermore, the technology according to the present disclosure is an environmentally friendly technology that can reduce consumption of fossil fuels through reduced power consumption.

BRIEF DESCRIPTION OF THE DRAWINGS

The above and other aspects, features and advantages of the present disclosure will be more clearly understood from the following exemplary embodiments taken in conjunction with the accompanying drawings, in which.

DETAILED DESCRIPTION OF THE ILLUSTRATED EMBODIMENTS

Exemplary embodiments of the present disclosure will now be described in detail with reference to the accompanying drawings. The following embodiments are given by way of illustration only so as to provide a thorough understanding of the invention to those skilled in the art and may be embodied in different forms.

Figure 1:
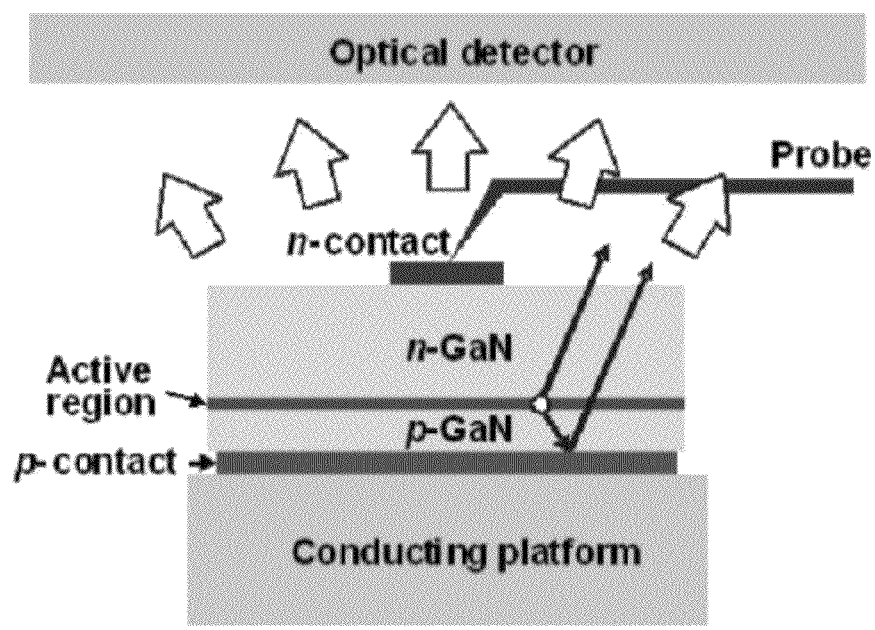
FIG. 1 is a side section view of a vertical GaN-based light emitting diode according to an exemplary embodiment of the present disclosure, diagrammatically showing an optical measurement method.

FIG. 1 is a side section view of a vertical GaN-based light emitting diode according to one exemplary embodiment of the present disclosure, diagrammatically showing an optical measurement method. The vertical GaN-based light emitting diode is fabricated by growing an epitaxial thin film of a GaN-based light emitting diode on a sapphire substrate, lifting-off the epitaxial thin film from the substrate using a laser, and then bonding the vertical GaN-based light emitting diode to a metal substrate such as a Ni, Au, Cu or Ni—Fe alloy substrate, or to a semiconductor substrate such as an Si or GaAs substrate. In this case, an existing Ni/Au electrode or highly reflective Ni/Ag/Ru/Ni/Au electrode is used as a p-type ohmic electrode layer, and an n-type semiconductor layer at an upper portion of the light emitting diode is subjected to a process of forming quasi-photonic crystals and/or surface roughening. A Cr/Au electrode is used as an n-type ohmic electrode layer. Then, an optical detector is used to detect the light directly emitted from an active layer and the light reflected by the p-type electrode when a predetermined electric current is applied to the light emitting diode through a probe.

Figure 2:
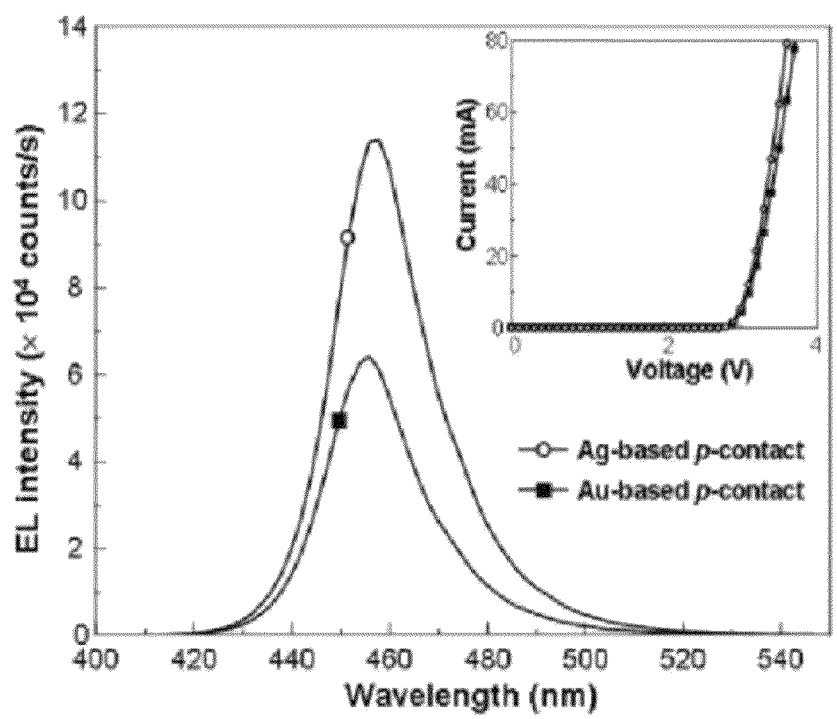
FIG. 2 is a graph depicting electro luminance spectra and current-voltage curves of vertical GaN-based light emitting diodes.

FIG. 2 shows a graph depicting electro luminance spectra and current-voltage curves of the fabricated vertical GaN-based light emitting diodes. Both the vertical GaN-based light emitting diode including the existing Au-based p-type electrode and the vertical GaN-based light emitting diode including the Ag-based p-type electrode according to the embodiment exhibit substantially the same current-voltage curves. However, it can be seen that the light emitting diode including the Ag-based p-type electrode has a much greater optical output than the light emitting diode including the Au-based p-type electrode.

The total thickness of the Ag-based p-type electrode including an Ag layer is 1000~5000 Å, and the thickness of the Ag layer is 500~5000 Å. Advantageously, the Ag-based p-type electrode may be subjected to heat treatment under an oxygen atmosphere to obtain low contact resistance. The Ag-based p-type electrode has a high reflectivity of 60~95% to light in a wavelength range of 300~1000 nm.

Figure 3:
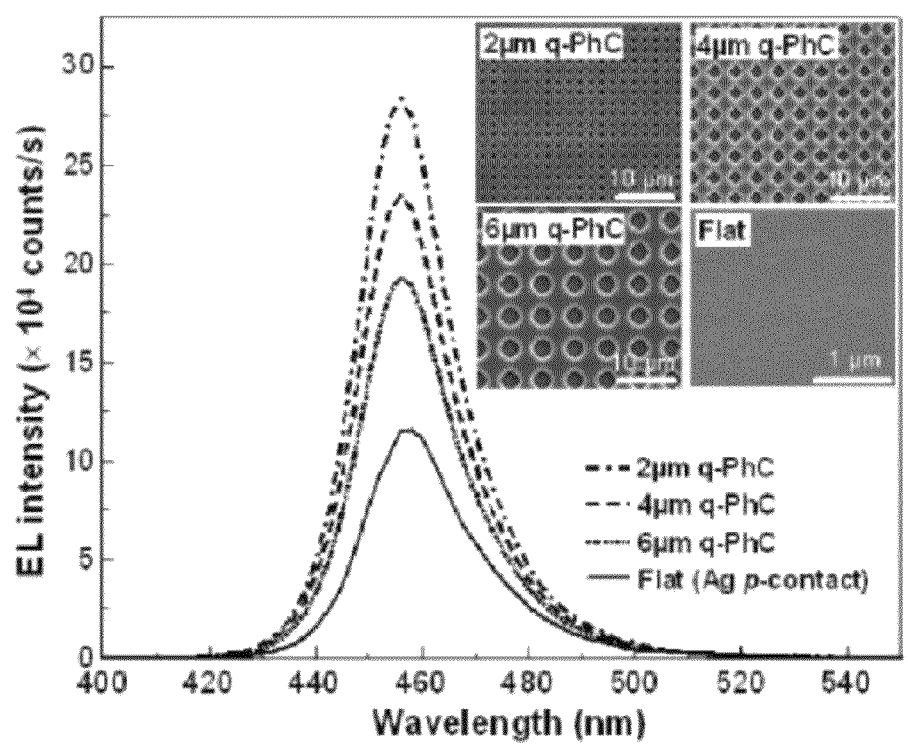
FIG. 3 shows electro luminance spectra of a vertical GaN-based light emitting diode manufactured using an Ag-based highly reflective p-type electrode and quasi-photonic crystals (q-PhC) according to an exemplary embodiment of the present disclosure, and SEM images of a surface of an n-type semiconductor layer of the vertical GaN-based light emitting diodes.

FIG. 3 shows a graph depicting variation of electro luminance spectra upon application of quasi-photonic crystals having different sizes to the vertical GaN-based light emitting diode including the Ag-based highly reflective p-type electrode, and SEM images of a surface of the n-type semiconductor layer on which the quasi-photonic crystals are formed. When the quasi-photonic crystals are formed on the n-type semiconductor layer, the light emitting diode exhibits significantly improved optical output. Particularly, when the quasi-photonic crystals are repeatedly formed at a pitch of 2 μm, optical output from the light emitting diode increases by about 2.5 times. Previous reports state that an optimal photonic crystal pitch capable of obtaining the maximum optical output from the GaN-based light emitting diode is in the range of 200~1500 nm. As such, since a photonic crystal pitch of 2 μm of the present invention is greater than the optimal photonic crystal pitch, the photonic crystal according to the embodiment is referred to as a quasi-photonic crystal.

The quasi-photonic crystals can be easily formed through general optical lithography patterning, thereby achieving large wafer processing and low manufacturing costs, instead of electron beam lithography patterning which results in high manufacturing costs and is difficult to apply to large wafer processing. After patterning, the semiconductor layer is advantageously subjected to anisotropic dry etching instead of isotropic wet etching.

Figure 4:
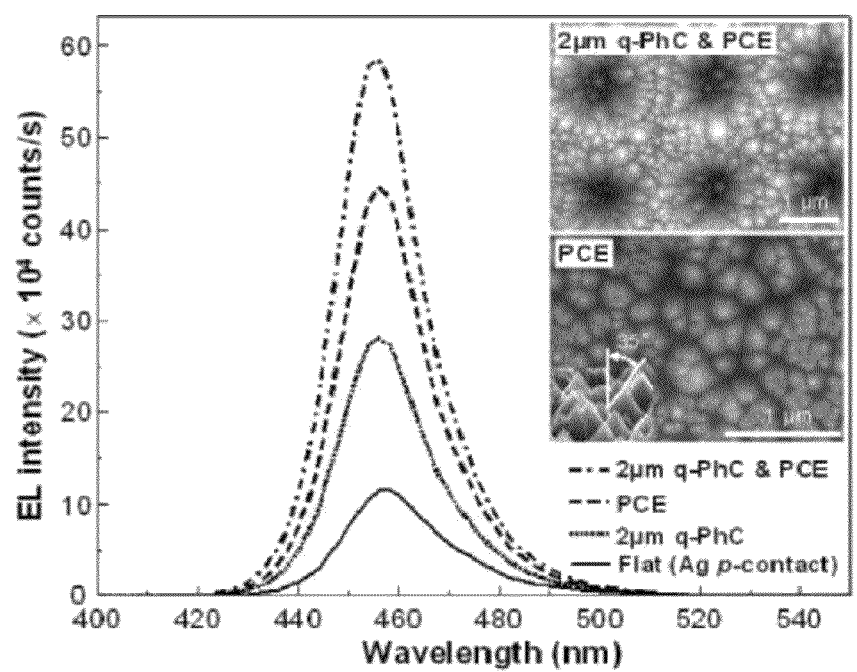
FIG. 4 shows electro luminance spectra of a vertical GaN-based light emitting diode including an Ag-based highly reflective p-type electrode, quasi-photonic crystals and subjected to PCE surface roughening according to an exemplary embodiment of the present disclosure, and SEM images of a surface of an n-type semiconductor layer of the vertical GaN-based light emitting diode.

FIG. 4 shows a graph depicting variation of electro luminance spectra upon application of surface roughening via photochemical etching (PCE) to the vertical GaN-based light emitting diode including the Ag-based highly reflective p-type electrode and/or the quasi-photonic crystals, and SEM images of a surface of the n-type semiconductor layer to which surface roughening is applied. It can be seen that hexagonal pyramids are formed on the surface of the semiconductor layer through surface roughening. Although the light emitting diode achieves significant improvement in optical output through surface roughening alone, the light emitting diode may have the maximum optical output upon application of both the quasi-photonic crystals and the surface roughening.

To achieve the surface roughening, the light emitting diode is dipped into a strong basic solution such as KOH or NaOH solution, followed by UV exposure using a high is output UV source such as a Xe lamp. In this case, the basic solution has a molar concentration of 0.1~10 M, and the UV source emits UV beams in a wavelength range of 100~400 nm.

Figure 5:
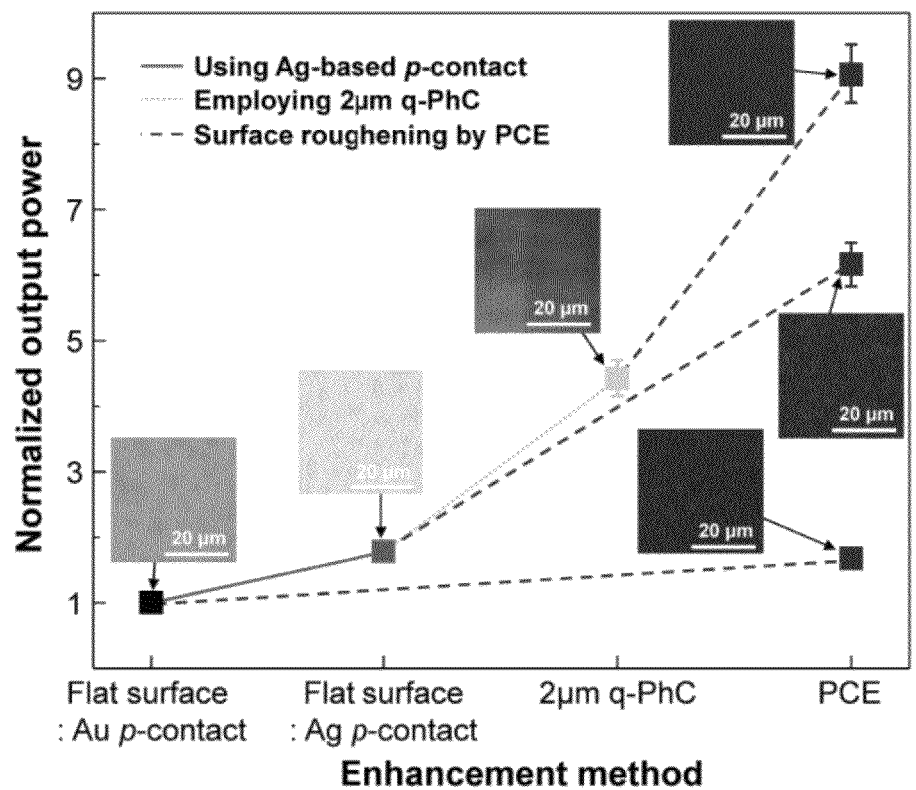
FIG. 5 shows variation in optical output from a vertical GaN-based light emitting diode in each stage upon application of an Ag-based highly reflective p-type electrode, quasi-photonic crystals, and PCE surface roughening according to an exemplary embodiment of the present disclosure, and SEM images of a surface of an n-type semiconductor layer of the vertical GaN-based light emitting diode.

FIG. 5 is a graph depicting variation in optical output from the vertical GaN-based light emitting diode and SEM images of the n-type semiconductor layer according to sequential application of the Ag-based highly reflective p-type electrode, quasi-photonic crystal and surface roughening. It can be seen that the vertical light emitting diode is gradually increased in optical power and finally obtains 9 times increase of the optical output by sequential application of the Ag-based p-type electrode, quasi-photonic crystal and surface roughening to the light emitting diode, as compared with the vertical light emitting diode including the existing Au-based p-type electrode. On the contrary, the vertical light emitting diode including the Au-based p-type electrode exhibits a negligible increase in optical output upon application of the surface roughening thereto.

The invention claimed is:

1. A vertical GaN-based light emitting diode, comprising:
   a substrate;
   a first-doping type ohmic electrode layer arranged on the substrate;
   a first-doping type GaN-based III-V group semiconductor layer arranged on the first-doping type ohmic electrode layer;
   a second-doping type GaN-based III-V group semiconductor layer arranged on the first-doping type GaN-based III-V group semiconductor layer; and
   a second-doping type ohmic electrode layer arranged on the second-doping type GaN-based III-V group semiconductor layer,
   wherein the first-doping type ohmic electrode layer comprises an Ag-based electrode, and the second-doping type GaN-based III-V group semiconductor layer comprises photonic crystals arranged on an outer surface thereof at a pitch of about 2 μm and a portion of the outer surface between the photonic crystals roughened by photochemical etching.

2. The vertical GaN-based light emitting diode of claim 1, wherein the Ag-based electrode comprises Ag or an Ag alloy.

3. The vertical GaN-based light emitting diode of claim 2, wherein the Ag-based electrode comprises Ni/Ag/Ru/Ni/Au.

4. The vertical GaN-based light emitting diode of claim 3, wherein a thickness of an Ag layer of the Ag-based electrode is about 500~5000 Å.

5. The vertical GaN-based light emitting diode of claim 1, wherein the photonic crystals each comprise repeatedly formed pores or protrusions.

6. The vertical GaN-based light emitting diode of claim 1, wherein the second-doping type ohmic electrode layer comprises Ti, Ta, Al, Cr, or Au.

7. The vertical GaN-based light emitting diode of claim 1, wherein the electroluminescent intensity thereof at an output wavelength of about 460nm is in a range of 55 to $60 \times 10^4$ counts/s.

8. The vertical GaN-based light emitting diode of claim 1, wherein the first-doping type comprises a p-type and the second-doping type comprises an n-type.

9. A method of manufacturing a vertical GaN-based light emitting diode, the method comprising:
   forming a first-doping type ohmic electrode layer on a substrate;
   forming a first-doping type GaN-based III-V group semiconductor layer on the first-doping type ohmic electrode layer;
   forming a second-doping type GaN-based III-V group semiconductor layer on the first-doping type GaN-based III-V group semiconductor layer; and
   forming a second-doping type ohmic electrode layer on the second-doping type GaN-based III-V group semiconductor layer,
   wherein the first-doping type ohmic electrode layer comprises an Ag-based electrode, and an outer surface of the second-doping type GaN-based III-V group semiconductor layer is subjected to a process of forming photonic crystals at a pitch of about 2μm, and a portion of the outer surface between the photonic crystals is subjected to a process of surface roughening using photochemical etching.

10. The method of claim 9, wherein the Ag-based electrode comprises Ag or an Ag alloy.

11. The method of claim 10, wherein the Ag-based electrode comprises Ni/Ag/Ru/Ni/Au layers.

12. The method of claim 11, wherein a thickness of an Ag layer of the Ag-based electrode is about 500~5000 Å.

13. The method of claim 9, wherein forming the first-doping type ohmic electrode layer comprises a heat treatment under an oxygen atmosphere to obtain low contact resistance.

14. The method of claim 9, wherein the process of forming the photonic crystals comprises forming pores or protrusions on the outer surface of the second-doping type GaN-based III-V group semiconductor layer.

15. The method of claim 9, wherein the process of forming the photonic crystals comprises photolithography-based patterning and dry etching.

16. The method of claim 9, wherein the process of surface roughening is performed using a strong basic solution.

17. The method of claim 16, wherein the process of surface roughening comprises ultraviolet (UV) exposure.

18. The method of claim 17, wherein the process of surface roughening comprises dry etching to increase surface roughness of the second-doping type GaN-based III-V group semiconductor layer.

19. The method of claim 9, wherein the second-doping type ohmic electrode layer comprises Ti, Ta, Al, Cr, or Au.

20. The method of claim 9, wherein the electroluminescent intensity of the vertical GaN-based light emitting diode at an output wavelength of about 460nm is in a range of 55 to $60 \times 10^4$ counts/s.

21. The method of claim 9, wherein the first-doping type comprises a p-type and the second-doping type comprises an n-type.

* * * * *